(12) United States Patent
Bol et al.

(10) Patent No.: US 9,887,361 B2
(45) Date of Patent: Feb. 6, 2018

(54) METHODS FOR FORMING A CARBON NANOTUBE-GRAPHENE HYBRID FILM ON A SUBSTRATE

(71) Applicants: International Business Machines Corporation, Armonk, NY (US); Egypt Nanotechnology Center, Cairo (EG)

(72) Inventors: Ageeth A. Bol, Yorktown Heights, NY (US); Bhupesh Chandra, Jersey City, NJ (US); Amal Kasry, White Plains, NY (US); Ahmed Maarouf, Mohegan Lake, NY (US); Glenn J. Martyna, Croton on Hudson, NY (US); George S. Tulevski, White Plains, NY (US)

(73) Assignees: International Business Machines Corporation, Armonk, NY (US); Egypt Nanotechnology Center, Cairo (EG)

( * ) Notice: Subject to any disclaimer, the term of this patent is extended or adjusted under 35 U.S.C. 154(b) by 235 days.

(21) Appl. No.: 14/820,028

(22) Filed: Aug. 6, 2015

(65) Prior Publication Data
US 2015/0349264 A1 Dec. 3, 2015

Related U.S. Application Data

(62) Division of application No. 13/301,943, filed on Nov. 22, 2011, now Pat. No. 9,177,688.

(51) Int. Cl.
*C23C 16/02* (2006.01)
*C23C 16/26* (2006.01)
(Continued)

(52) U.S. Cl.
CPC .......... *H01L 51/0048* (2013.01); *B82Y 10/00* (2013.01); *B82Y 40/00* (2013.01);
(Continued)

(58) Field of Classification Search
CPC ................................ C23C 16/26; C23C 16/02
See application file for complete search history.

(56) References Cited

U.S. PATENT DOCUMENTS 5,690,807 A * 11/1997 Clark, Jr. ................. C25F 3/12
205/655
2003/0004058 A1 1/2003 Li et al.
(Continued)

FOREIGN PATENT DOCUMENTS

DE  112011102747 T5  7/2013
WO    2012096914 A1  7/2012

OTHER PUBLICATIONS

Dong, Xiaochen, et al., "One-step growth of graphene-carbon nanotube hybrid materials by chemical vapor deposition". Carbon 49 (2011) 2944-2949.*

(Continued)

*Primary Examiner* — Bret Chen
(74) *Attorney, Agent, or Firm* — Ryan, Mason & Lewis, LLP

(57) ABSTRACT

A nanotube-graphene hybrid film and method for forming a cleaned nanotube-graphene hybrid film. A method includes depositing nanotube film over a metal foil to produce a layer of nanotube film, placing the metal foil with as-deposited nanotube film in a chemical vapor deposition furnace to grow graphene on the nanotube film to form a nanotube-graphene hybrid film, and transferring the nanotube-graphene hybrid film over a substrate.

16 Claims, 9 Drawing Sheets

(51) Int. Cl.

| | | |
|---|---|---|
| H01L 51/00 | (2006.01) | |
| H01L 51/05 | (2006.01) | |
| H01B 1/04 | (2006.01) | |
| H01L 51/10 | (2006.01) | |
| H01L 29/16 | (2006.01) | |
| H01L 29/778 | (2006.01) | |
| H01L 29/66 | (2006.01) | |
| H01L 29/786 | (2006.01) | |
| B82Y 10/00 | (2011.01) | |
| B82Y 40/00 | (2011.01) | |
| C01B 32/158 | (2017.01) | |
| C01B 32/182 | (2017.01) | |
| C01B 32/186 | (2017.01) | |
| C01B 32/192 | (2017.01) | |
| H01L 29/06 | (2006.01) | |
| B82Y 30/00 | (2011.01) | |

(52) U.S. Cl.
CPC .......... *C01B 32/158* (2017.08); *C01B 32/182* (2017.08); *C01B 32/186* (2017.08); *C01B 32/192* (2017.08); *C23C 16/26* (2013.01); *H01B 1/04* (2013.01); *H01L 29/1606* (2013.01); *H01L 29/66742* (2013.01); *H01L 29/778* (2013.01); *H01L 29/78618* (2013.01); *H01L 29/78684* (2013.01); *H01L 29/78696* (2013.01); *H01L 51/0025* (2013.01); *H01L 51/0545* (2013.01); *H01L 51/0562* (2013.01); *H01L 51/102* (2013.01); *H01L 51/105* (2013.01); *B82Y 30/00* (2013.01); *C01B 2202/00* (2013.01); *C01B 2204/00* (2013.01); *H01L 29/0673* (2013.01); *H01L 51/0566* (2013.01); *Y10S 977/742* (2013.01); *Y10S 977/75* (2013.01); *Y10S 977/938* (2013.01); *Y10T 428/30* (2015.01)

(56) References Cited

U.S. PATENT DOCUMENTS

| | | |
|---|---|---|
| 2003/0122111 A1 | 7/2003 | Glatkowski |
| 2006/0165896 A1 | 7/2006 | Afzali-Ardakani |
| 2007/0065974 A1 | 3/2007 | Shiraishi |
| 2007/0284557 A1 | 12/2007 | Gruner |
| 2008/0078441 A1* | 4/2008 | Poplayskyy .......... H01L 31/076 136/255 |
| 2008/0102036 A1* | 5/2008 | Poss ................... A61K 49/0017 424/9.6 |
| 2008/0149566 A1 | 6/2008 | Messersmith |
| 2008/0170982 A1 | 7/2008 | Zhang et al. |
| 2008/0179547 A1* | 7/2008 | Henley ............. H01L 21/76254 250/492.21 |
| 2008/0224164 A1* | 9/2008 | Huang .................... C23C 16/30 257/98 |
| 2009/0017211 A1 | 1/2009 | Gruner et al. |
| 2009/0146111 A1 | 6/2009 | Shin et al. |
| 2009/0169996 A1 | 7/2009 | Zhamu et al. |
| 2009/0174435 A1 | 7/2009 | Stan |
| 2009/0235721 A1 | 9/2009 | Robinson et al. |
| 2009/0308520 A1 | 12/2009 | Shin et al. |
| 2010/0025660 A1 | 2/2010 | Jain |
| 2010/0047522 A1 | 2/2010 | Sivarajan et al. |
| 2010/0273060 A1 | 10/2010 | Yang et al. |
| 2011/0003174 A1 | 1/2011 | Hikata et al. |
| 2011/0017921 A1 | 1/2011 | Jiang et al. |
| 2011/0041980 A1 | 2/2011 | Kim et al. |
| 2012/0021224 A1 | 1/2012 | Everett et al. |
| 2012/0121891 A1 | 5/2012 | Kim |
| 2014/0313636 A1* | 10/2014 | Tour .................... C01B 31/0438 361/502 |

OTHER PUBLICATIONS

Zhu, Yu, et al., "A seamless three-dimensional carbon nanotube graphene hybrid material". Nature Communications, 3:1225, 2012, pp. 1-7.*
Heo, Kwang, et al., "Carbon and metal nanotube hybrid structures on graphene as efficient electron field emitters". Nanotechnology 27 (2016) 275301 pp. 1-7.*
"Graphene-nanotube hybrid boost lithium metal batteries" (May 18, 2017) retrieved Jun. 9, 2017. 3 pages.*
Wang, Frank, "Novel Optoelectronic Devices based on Planar Graphene-Nanotube Hybrid Film". 2016 IEEE Nanotechnology Materials and Devices Conference (NMDC). One page. Abstract Only.*
Jeong et al. Flexible Room-Temperature NO2 Gas Sensors Based on Carbon Nanotubes/Reduced Graphene Hybrid Films, Applied Physical Letters, vol. 96, No. 21, pp. 213105-213105-3, May 2010.
Tung et al. Low Temperature Solution Processing of Graphene-Carbon Nanotube Hybrid Materials for High- Performance Transparent Conductors, Nano Letters, vol. 9, No. 5, 2009.
Yu et al. Self-Assembled Graphene/Carbon Nanotube Hybrid Films for Supercapacitors, J. Phys. Chem. Lett., vol. 1, No. 2, Dec. 2009.
Purification and Characterization of Single Walled Nanotubes, Chiang J. Phys. Chem. B 2001, 105, 1157-1161.
Jiaping Wang; Removal of the Residual Surfactants in Transparent and Conductive Single-Walled Carbon Nanotube Films, J. Phys. Chem. C 2009, 113, 17685-17690.
Chemical Doping of Large-area Stacked Graphene Films for Use as Transparent Conducting Electrodes, Kasry; ACS NANO, vol. 4, No. 7, pp. 3839-3844, Jul. 2010.

* cited by examiner

US 9,887,361 B2

METHODS FOR FORMING A CARBON NANOTUBE-GRAPHENE HYBRID FILM ON A SUBSTRATE

CROSS REFERENCE TO RELATED APPLICATIONS

This application is a divisional of U.S. Pat. No. 9,177,688, filed Nov. 22, 2011, which is expressly incorporated by reference herein.

FIELD OF THE INVENTION

Embodiments of the invention generally relate to electronic devices and, more particularly, to transparent conductors.

BACKGROUND OF THE INVENTION

The ever-increasing cost of indium, a rare earth element used in coatings for transparent conductors (TCs), has given an impetus for research into several alternatives for use as a TC. Indium tin oxide (ITO) and other amorphous TCs (fluorine doped zinc oxide, etc.) also have problems with use in the flexible electronic industry.

In recent years, carbon nanotube films and graphene have emerged as potential replacements for ITO as a TC in various technological applications such as photovoltaic devices, electronic displays, etc. However, these alternatives still fall short of the required performance for TC coatings in terms of transparency and sheet resistance. Accordingly, a need exists for effective alternatives for TC coating.

SUMMARY OF THE INVENTION

In one aspect of the invention, a method for forming a cleaned nanotube-graphene hybrid film is provided. The method includes the steps of depositing nanotube film over a substrate to produce a layer of nanotube film, removing impurities from a surface of the layer of nanotube film not contacting the substrate to produce a cleaned layer of nanotube film, depositing a layer of graphene over the cleaned layer of nanotube film to produce a nanotube-graphene hybrid film, and removing impurities from a surface of the nanotube-graphene hybrid film to produce a cleaned nanotube-graphene hybrid film, wherein the hybrid film has improved electrical performance via decreasing nanotube resistance by increasing contact area through use of graphene as a bridge.

Another aspect of the invention includes a nanotube-graphene hybrid film. The hybrid film includes a target substrate, a layer of nanotube film deposited over the target substrate, and a layer of graphene deposited over the layer of nanotube film.

Yet another aspect of the invention includes a method for forming a nanotube-graphene hybrid film on a substrate. The method includes the steps of depositing nanotube film over a metal foil to produce a layer of nanotube film, placing the metal foil with as-deposited nanotube film in a chemical vapor deposition furnace to grow graphene on the nanotube film to form a nanotube-graphene hybrid film, and transferring the nanotube-graphene hybrid film over a desired substrate.

These and other objects, features and advantages of the present invention will become apparent from the following detailed description of illustrative embodiments thereof, which is to be read in connection with the accompanying drawings.

DETAILED DESCRIPTION OF EMBODIMENTS

An aspect of the invention includes a carbon nanotube (CNT)-graphene hybrid as a transparent conductor. As detailed herein, an embodiment of the invention uses CNTs to improve the performance of graphene transparent electrodes. For example, an aspect of the invention includes a combination of thin films of nanotube and graphene, where the thin films of nanotubes are deposited over graphene or vice versa. Additionally, this combination can be used in coatings for transparent conductors (TCs).

In an aspect of the invention, the electrical performance of thin films of nanotube and graphene is improved by depositing thin films of nanotubes over graphene or vice versa. As detailed herein, this arrangement decreases the tube-tube resistance by increasing the contact area through the use of graphene as a bridge. Also, nanotubes act as a bridge across the grain boundary scattering sites of graphene, thereby increasing the graphene conductivity. Additionally, in contrast to existing approaches, an aspect of the invention includes increasing the 'out of plane' conductivity of stacked graphene sheets. As noted, nanotubes also act as bridges between stacked graphene sheets, which results in higher electron transmission probability between them.

Figure 1:
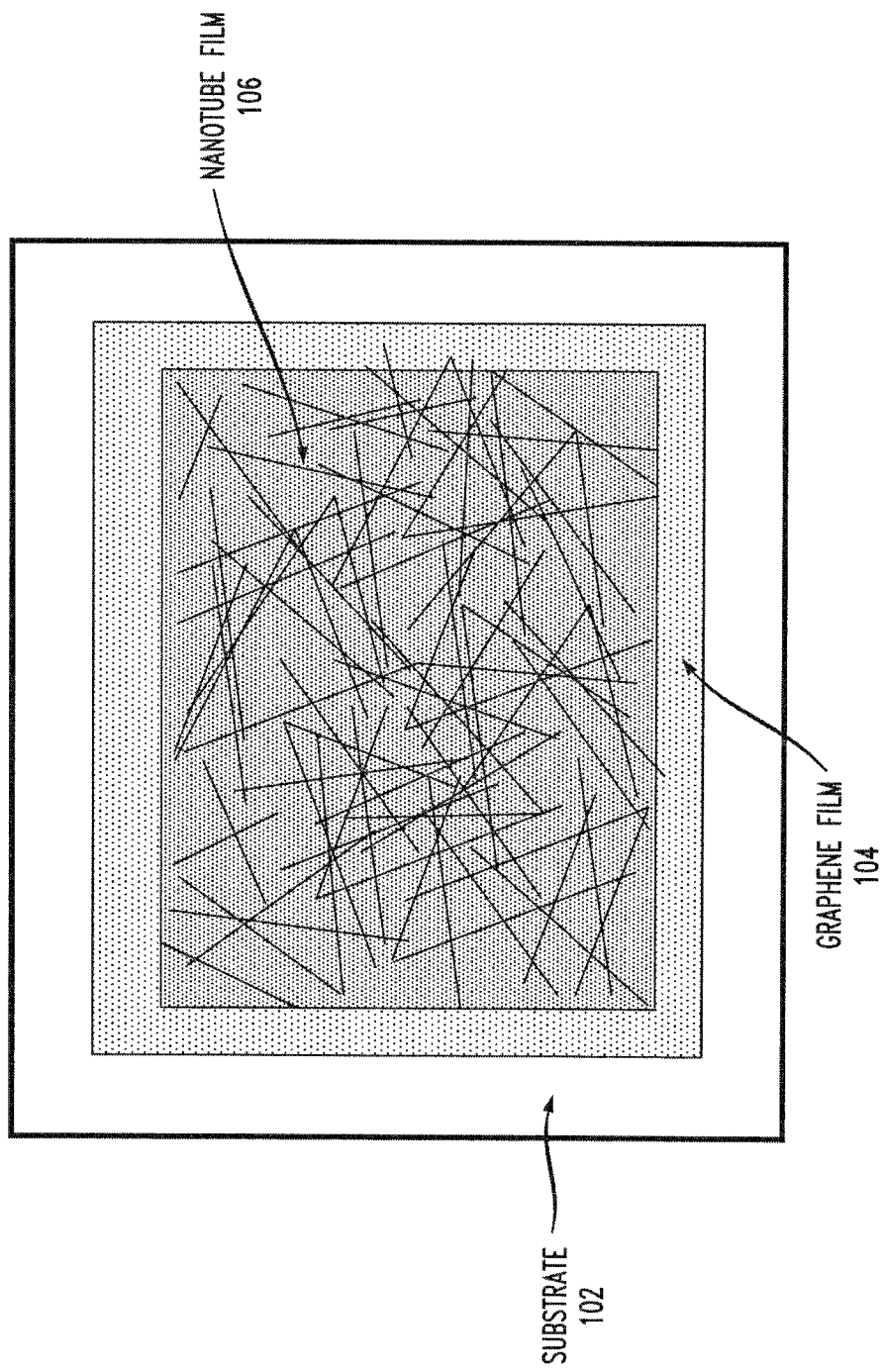
FIG. 1 is a diagram illustrating an example schematic of the carbon nanotube-graphene composite, according to an embodiment of the present invention.

FIG. 1 is a diagram illustrating an example schematic of the carbon nanotube-graphene composite, according to an embodiment of the present invention. By way of illustration, FIG. 1 depicts a substrate 102, a graphene film 104 and a nanotube film 106. The components of this example schematic and detailed further herein.

Figure 2:
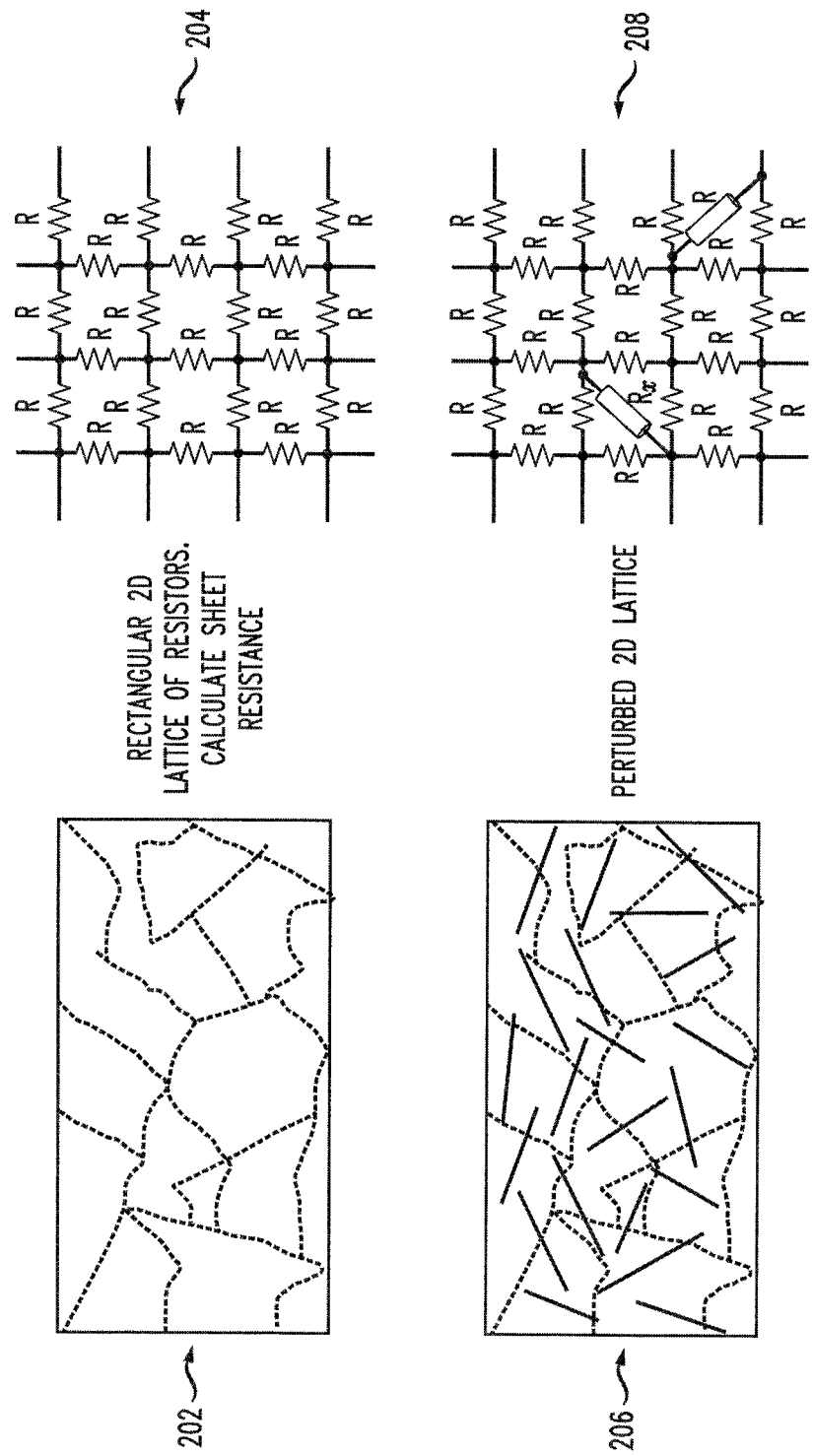
FIG. 2 is a diagram illustrating two-dimensional (2D) resistor lattices as a model system for a CNT-graphene hybrid, according to an embodiment of the present invention.

FIG. 2 is a diagram illustrating example two-dimensional (2D) resistor lattices, according to an embodiment of the present invention. By way of illustration, FIG. 2 depicts a rectangular 2D lattice of resistors 202 with a corresponding sheet resistance depiction 204, and a perturbed 2D lattice 206 with a corresponding sheet resistance depiction 208. As detailed herein, carbon nanotubes (depicted as the solid lines dispersed throughout lattice 206) act as a bridge for electrons to move across graphene grain boundaries, thereby decreasing the scattering at the grain boundaries. Such a system can be modeled as a resistance network, such as depicted in image 208.

Figure 3:
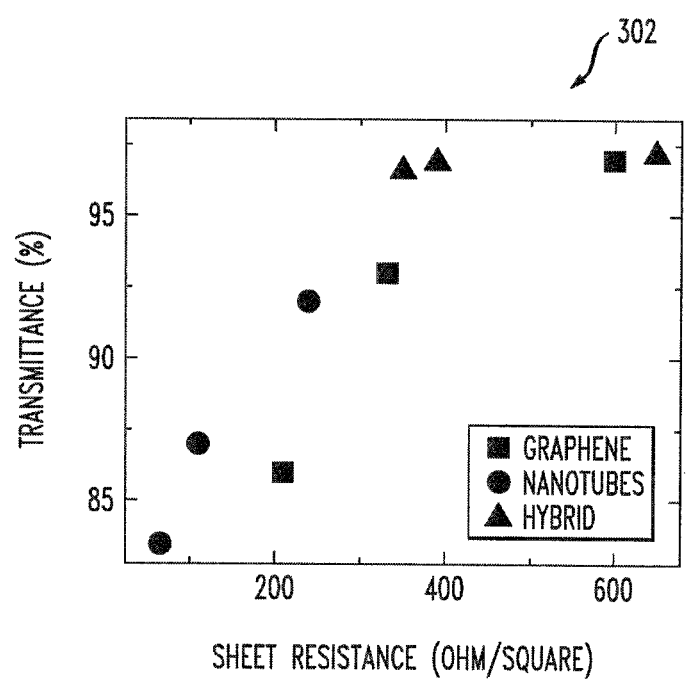
FIG. 3 is a diagram illustrating a transmittance and sheet resistance data comparison, according to an embodiment of the present invention.

FIG. 3 is a graph 302 illustrating a transmittance and sheet resistance data comparison, according to an embodiment of the present invention. By way of illustration, FIG. 3 depicts a comparison of CNT-graphene hybrid with CNT films and graphene with respect to transmittance and sheet resistance data. It is shown through this graph that a CNT-graphene hybrid film has a much higher transparency and a low sheet resistance in comparison to an individual thin CNT film or a graphene film. In particular, such an advantage is more enhanced at high light transparencies.

Figure 4:
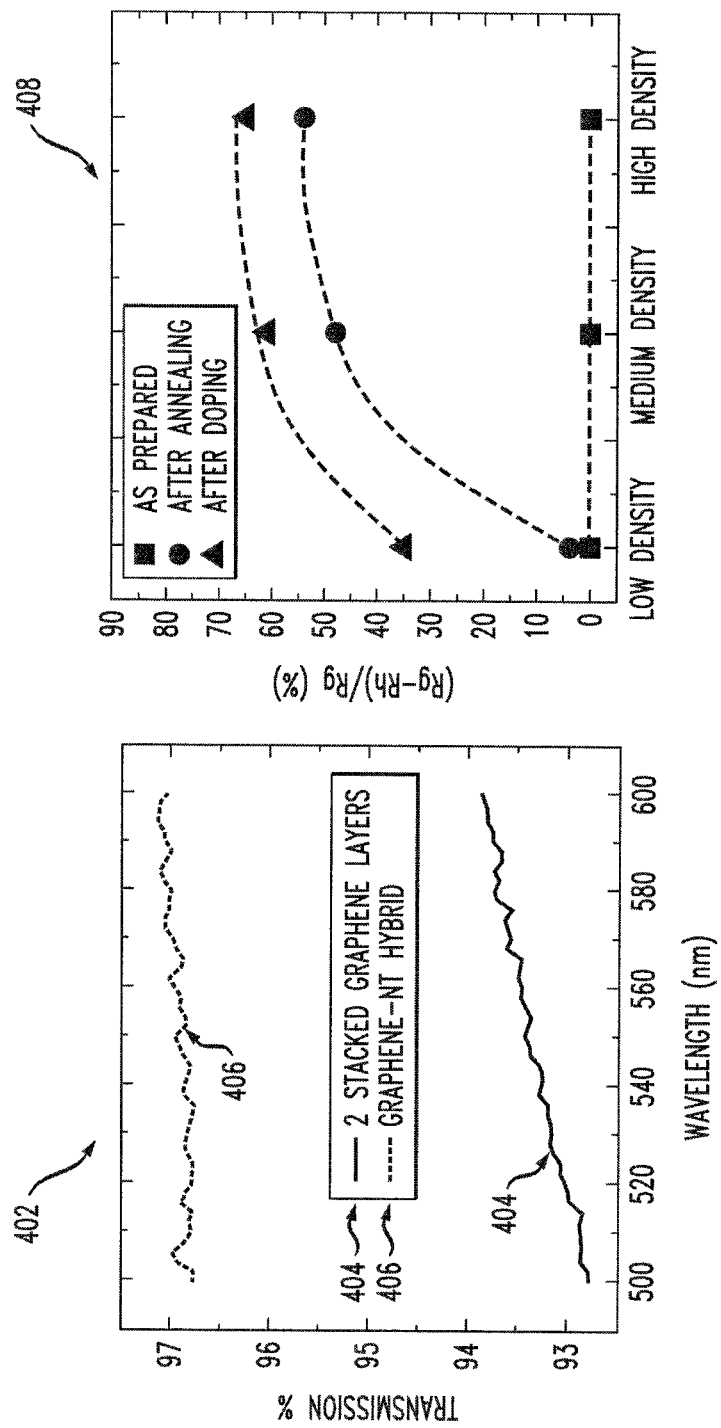
FIG. 4 includes graphs illustrating transmittance and sheet resistance data, according to an embodiment of the present invention.

FIG. 4 includes graphs illustrating transmittance and sheet resistance data, according to an embodiment of the present invention. By way of illustration, graph 402 depicts light transmittance through a CNT-graphene hybrid 406 and a two layer graphene sheet 404. Graph 402 illustrates that two stacked layers of graphene are less transparent than a monolayer of CNTs stacked over a layer of graphene. Graph 408 depicts relative decrease in sheet resistance at various CNT densities used in making a hybrid. Increasing the CNT density in the hybrid film decreases its sheet resistance relative to the sheet resistance of a single layer of graphene. On the other hand, transparency of the hybrid does not change much (for example, as shown in graph 302).

Figure 5:
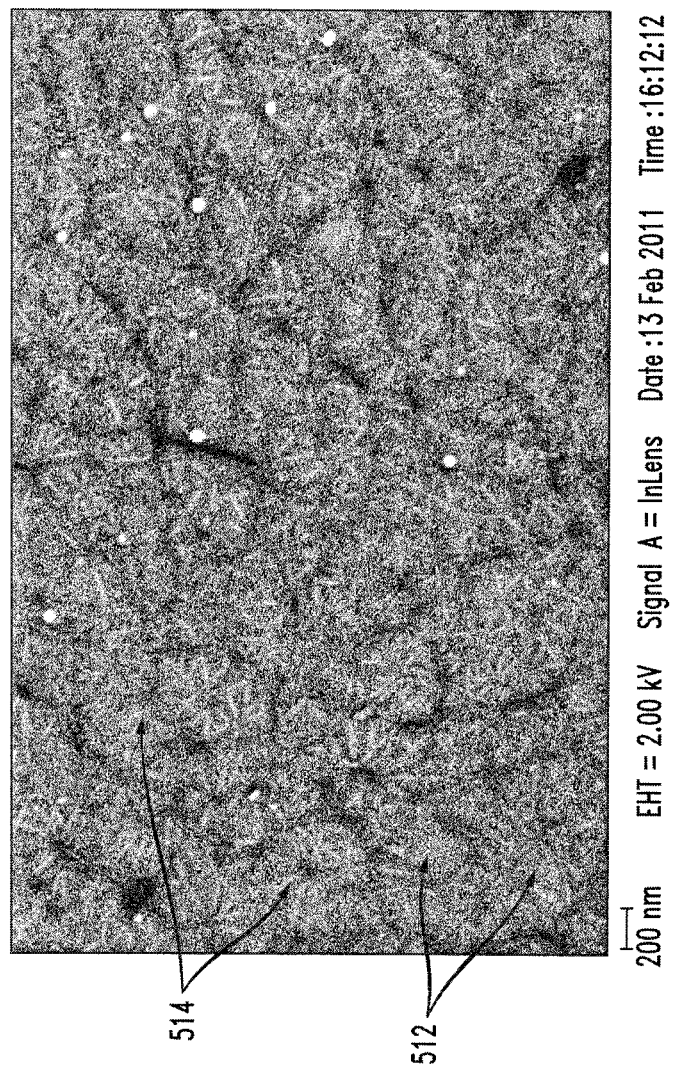
FIG. 5 is an example scanning electron microscope image of a carbon nanotube (CNT)-hybrid film, according to an embodiment of the present invention.

FIG. 5 is an example scanning electron microscope image of a CNT-hybrid film, according to an embodiment of the present invention. By way of illustration, FIG. 5 depicts a scanning electron microscope image showing graphene layer 512 transferred over a film of carbon nanotubes 514.

Figure 6:
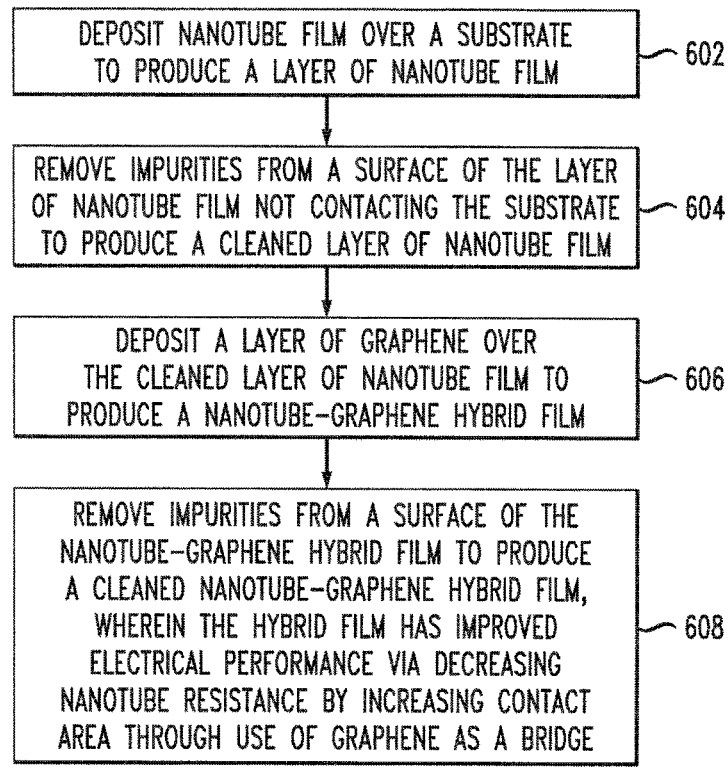
FIG. 6 is a flow diagram illustrating techniques for forming a cleaned nanotube-graphene hybrid film, according to an embodiment of the present invention.

FIG. 6 is a flow diagram illustrating techniques for forming a cleaned nanotube-graphene hybrid film, according to an embodiment of the present invention. Step 602 includes depositing nanotube film over a substrate to produce a layer of nanotube film. A substrate can be solid such as quartz, silicon, etc., or flexible (plastics). A layer of nanotube film can include a layer of carbon nanotube, a network of single wall carbon nanotubes, multi-wall nanotube, film of fullerene C60 molecules, sparse network films made up of any other organic or inorganic conducting materials such as metal nanowires (silver, gold, etc.), etc.

Depositing a layer of nanotube film over a target substrate to produce a layer of nanotube film can include performing a vacuum filtration process, a spray deposition process, drop casting a nanotube solution, a nanotube coating process, a chemical vapor deposition growth process, a water-surfactant solution based nanotube deposition process, using a self-assembled monolayer of amine terminated groups to increase nanotube adhesion on the substrate, etc.

As used above (and herein), in a vacuum filtration process, CNT solution in surfactant and water is passed through a filter paper using vacuum suction. A uniform CNT film is formed on top of the paper. The paper is then put in contact with a substrate with the CNT film facing the substrate. Pressure is applied to have good contact of CNT film with the substrate. Additionally, the filter paper is dissolved in organic solvent such as acetone, N-methylpyrrolidone (NMP), etc., leaving behind CNT film over the substrate.

Also, drop casting involves putting a drop of CNT solution in water or organic solvents on the desired substrate and then spinning the substrate for uniform coating of solution. A final drying step (either in air or in a vacuum oven) will remove the solvent. A chemical vapor deposition process involves deposition of metal catalyst particles (Fe, Mo, Co, Cu, Ni, etc.) on the substrate, placing the substrate in a high temperature chemical vapor deposition (CVD) oven, flowing carbon carrier gases (CO, CH4, C2H2, C2H4, ethanol, etc.) at temperatures ranging from 500-1000 degrees Celsius to grow carbon nanotubes from the catalyst particles.

Additionally, in a water-surfactant solution based nanotube deposition process, a surface is functionalized with self-assembled monolayers (for example, 3-Aminopropyl triethoxy silane or aminopropyl triethoxy silane (APTES)) which can attract CNTs. Thereafter, the CNT water-surfactant solution is deposited over substrate. The substrate is then rinsed with solvents such as water, alcohol, etc., leaving behind a uniform CNT film.

Step 604 includes removing impurities from a surface of the layer of nanotube film not contacting the substrate to produce a cleaned layer of nanotube film. Removing impurities from a surface of the layer of nanotube film can include using an acid, solvent and water cleaning technique. Such a technique can include the following steps. For removal of organic impurities, several oxidizing agents can be used such as hydrogen peroxide, piranha solution, etc. Solvents such as acetone, isopropyl alcohol, etc. can be used as well. Mild oxygen annealing at temperatures less than 350 degrees Celsius can also be used to remove amorphous organic impurities. Metal contamination can be removed via acid treatments such as nitric acid, sulfuric acid, etc. followed by a thorough water rinse.

Removing impurities from a surface of the layer of nanotube film can further includes annealing the layer of nanotube film under reduced pressure to remove any dried solvent. Additionally, a process referred to herein as vacuum annealing can be performed which includes heating a substrate with CNT film to a temperature of 80-120 degrees Celsius in a low to moderate vacuum. This helps in removing dried organic solvent residues as well as helps in removing the unintentional doping which might occur due to acid cleaning treatments.

Step 606 includes depositing a layer of graphene over the cleaned layer of nanotube film to produce a nanotube-graphene hybrid film. The layer of graphene can include a large area sheet of graphene. Also, depositing a layer of graphene over the cleaned layer of nanotube film to form a nanotube-graphene hybrid film includes transferring chemical vapor deposition grown graphene using several known transfer processes, such as polymer assisted transfer. The graphene films can also be directly obtained from bulk graphite through a scotch tape transfer process. Graphene can also be deposited through solution in the form of dissolved graphene oxide. This can be accomplished through spraying the solution or spinning graphene oxide flakes suspending in a solvent over the substrate containing CNTs, and graphene oxide flakes can later be reduced to graphene through gas or solution phase reducing treatments. In addition to graphene oxided flakes dissolved in polar solvents, an example embodiment of the invention can also include graphene flakes dissolved in organic solvents such as NMP and dimethylformamide (DMF). Such dissolved flakes can also be sprayed directly over CNT films with no need for a post deposition reduction step.

Step 608 includes removing impurities from a surface of the nanotube-graphene hybrid film to produce a cleaned nanotube-graphene hybrid film, wherein the hybrid film has improved electrical performance via decreasing nanotube resistance by increasing contact area through use of graphene as a bridge. Removing impurities from a surface of the nanotube-graphene hybrid film to produce a cleaned nanotube-graphene hybrid film can include using an acid, solvent and water cleaning technique. Also, removing impurities from a surface of the nanotube-graphene hybrid film to produce a cleaned nanotube-graphene hybrid film further includes annealing the nanotube-graphene hybrid film under reduced pressure to remove any dried solvent. Cleaning removes the impurities between physically contacted CNT and graphene films.

The techniques depicted in FIG. 6 also include chemically doping the cleaned nanotube-graphene hybrid film to increase conductivity. A CNT film can be a mixture of semiconducting and metallic CNTs. The doping permanently increases the charge concentration in semiconducting CNTs present in the film, thereby decreasing the sheet resistance of the network. The doping step also increases the electrical performance of the film. Doping the nanotube-graphene hybrid film can include using a solution doping technique. CNTs can be doped in solution before getting deposited over the substrate. Similarly, solution suspended graphene oxide flakes can be doped before getting deposited over CNTs. The dopants can be acid solutions such nitric acid, sulfuric acid, etc., or the dopants can be metal-organic compounds which can form charge-transfer complexes with the $sp^2$ bonded carbon atoms in CNT and graphene. As detailed herein, the resultant structure can appear as nanotubes scattered over (or under) a single (or multiple), large area graphene sheet reducing the sheet resistance of graphene.

The techniques depicted in FIG. 6 can additionally include repeating the steps of claim 1 to form a hybrid film with a desired transparency and at least one desired electrical property. Transparency can be changed by increasing or decreasing the film thickness. For example, a higher thickness has a lower light transparency. The techniques depicted in FIG. 6 need not be carried out in the sequence illustrated in the flow chart. By way of example, an embodiment of the invention can include depositing the graphene on a target substrate, cleaning the graphene film, and depositing a layer of nanotubes over the layer of graphene to form a nanotube-graphene hybrid film.

Doping is preferably conducted in solution phase, although gas phase doping is also feasible. For solution processes, organic solvents such as dichlorobenzene, dichloromethane, ethanol, acetonitrile, chloroform, methanol, butanol, among others, are suitable. Doping can be accomplished via charge transfer from the dopants to the nano-components, for example, interaction of the lone electron pairs of doping molecules with the quantum confined orbitals of semiconductor nanowires and nanocrystals which affects the concentration of carriers involved in charge transport.

With solution phase doping, for example, nano-components can be doped before and/or after their integration into a circuit on a chip. Nano-components can also be doped locally on the chip using techniques such as inkjet printing. The doping level along a nanowire, nanotube or a nanocrystal film can be varied by masking certain portions (for example, contacts) of the nano-component with resist and doping only the exposed portions. For device applications, nanowires can be protected from damage by implementing the doping at an appropriate stage during process integration.

Nanotubes, for example, carbon nanotubes, can be doped either in bulk by suspension of the nanotubes in a dopant solution, with or without heating; or immersing in the dopant solution a substrate supporting the nanotubes. Although carbon nanotubes are used as examples in the following discussions, doping methods of this invention can also be applied to other semiconducting nanotubes, which may include, for example, graphene, pentascene, fuellerence, etc., and combinations thereof.

Interaction of carbon nanotubes with the dopants, for example, via charge transfer, results in the formation of charged (radical cation) moeities close to the nanotubes. Bulk doping can be achieved by stirring a suspension of the carbon nanotubes in a dopant solution at a preferred temperature from about 20 degrees Celsius (C.) to about 50 degrees C., with a dopant concentration preferably from about 1 millimole (mM) to about 10 moles (M). Depending on the specific dopants and solvents, however, concentration ranging from about 0.0001 M to about 10 M may be used with temperatures from about 0 degrees C. to about 50 degrees C.

In general, the extent of doping depends on the concentration and temperature of the doping medium, and process parameters are selected according to the specific nano-component, dopant and solvent combination, as well as specific application needs or desired device characteristics.

Device doping, that is, doping the nanotube after it has been incorporated as part of a device structure of substrate, can be achieved by exposing the device or substrate with the nanotube to a dopant solution. By appropriately masking the nanotube, selective doping of portions of the nanotube can be achieved to produce desired doping profiles along the nanotube. As noted above, dopant concentration is preferably in the range of about 0.1 mM to about 10 M, more preferably from about 1 mM to about 1 M, and most preferably, from about 1 mM to about 10 mM, with the solution temperature preferably from about 10 degrees C. to about 50 degrees C., and more preferably, from about 20 degrees C. to about 50 degrees C. With device doping, the choice of process conditions also depends on compatibility with other materials present on the device or substrate. For example, while lower dopant concentrations tend to be less effective in general, too high a concentration of certain dopants may result in potential corrosion issues. In one embodiment, the doping is done under a $N_2$ atmosphere without stirring or agitation of the solution. However, agitation of the solution can be acceptable as long as it does not cause damage to the device.

Figure 7:
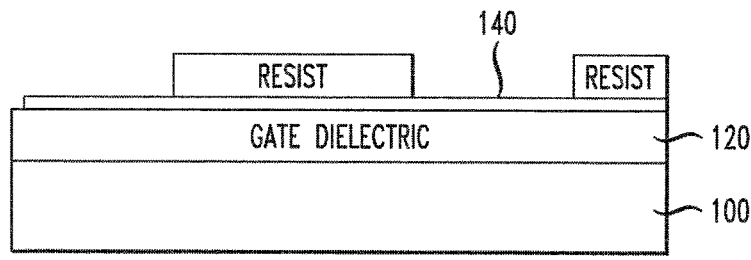
FIG. 7 illustrates a step in forming a field effect transistor (FET), according to an embodiment of the present invention.

As detailed below, FIGS. 7-10 illustrate steps of a method for forming a field effect transistor (FET). Accordingly, FIG. 7 illustrates a step in forming a field effect transistor (FET), according to an embodiment of the present invention. A gate dielectric 120 such as silicon dioxide, or oxynitride, or a high K material layer is deposited on gate 100, which is generally a doped silicon substrate. In an embodiment of the invention, the silicon substrate is degenerately doped. The gate dielectric can have a thickness, for example, from about 1 to about 100 nanometers (nm). A nano-component 140, for example, carbon nanotube-graphene hybrid, is deposited on gate dielectric 120 by spin-coating. A resist pattern is then formed on the carbon nanotube-graphene hybrid 140 by conventional lithographic techniques. For example, a resist layer can be deposited over the carbon nanotube-graphene hybrid 140 and patterned by using e-beam lithography or photolithography. With a positive resist, regions of the resist layer exposed to the e-beam or lithographic radiation are removed by using a developer, resulting in a structure with resist pattern shown in FIG. 7.

The resist pattern formed on the carbon nanotube-graphene hybrid may have one or multiple separations from about 10 nm to about 500 nm when e-beam lithography is used, and from about 500 nm to about 10 µm with photolithography. The multiple separations correspond to the line and space separations resulting from the respective lithographic techniques, and represent separations between adjacent top gates. The availability of multiple top gates provides flexibility of individual control for different logic applications, for example, AND, OR, NOR operations.

Figure 8:
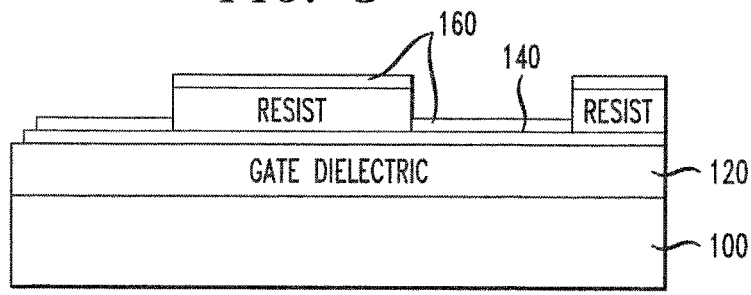
FIG. 8 illustrates a step in forming a field effect transistor (FET), according to an embodiment of the present invention.

As shown in FIG. 8, a metal 160, having a thickness ranging from about 15 nm to about 50 nm, is deposited on the resist pattern and over portions of the carbon nanotube-graphene hybrid 140. The metal can be Pd, Ti, W, Au, Co, Pt, or alloys thereof, or a metallic nanotube-graphene hybrid. If a metallic nanotube-graphene hybrid is used, the metal 160 may include one or more metallic nanotube-graphene hybrids. Other metals or alloys of Pd, Ti, W, Au, Co, Pt, can be deposited by e-beam or thermal evaporation under vacuum, while metallic nanotube-graphene hybrids can be deposited with solution phase techniques such as spin coating.

Following deposition of the metal, the structure can be immersed in acetone or N-methylpyrrolidone (NMP) for resist liftoff, a process that removes the lithographically patterned resist and the metal deposited on top by soaking the sample in solvents such as acetone or NMP. For example, such solvents can also be referred to generally as resist liftoff components.

Figure 9:
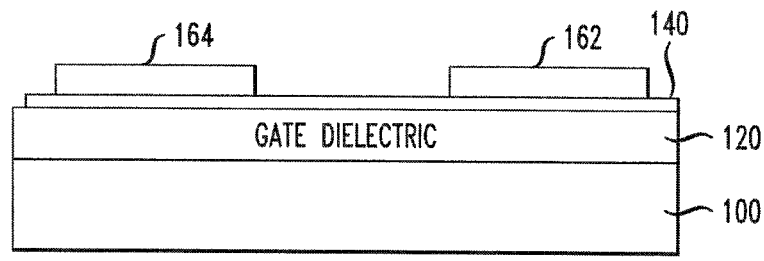
FIG. 9 illustrates a step in forming a field effect transistor (FET), according to an embodiment of the present invention.
Figure 10:
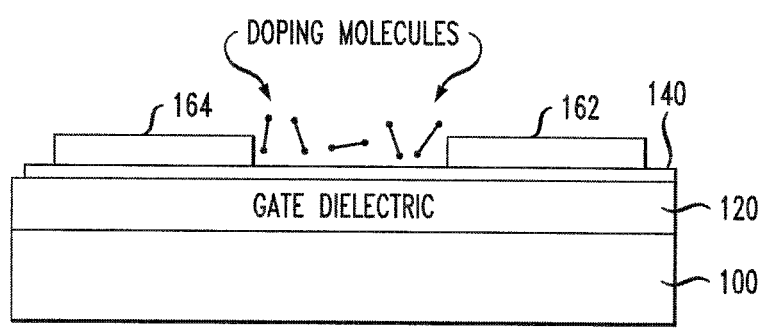
FIG. 10 illustrates a step in forming a field effect transistor (FET), according to an embodiment of the present invention.

As depicted in FIG. 9, the metal portions 162 and 164 remaining on the carbon nanotube-graphene hybrid 140 form the FET source and drain. In this embodiment, the source and drains are formed over a first and a second region, respectively, of the carbon nanotube-graphene hybrid 140, or more generally, of the nano-component 140. Following resist liftoff, the structure in FIG. 9 with the carbon nanotube-graphene hybrid 140 is immersed in an organic solution comprising a suitable dopant as described herein in connection with an embodiment of the invention. FIG. 10 illustrates the doping molecules bonding to the carbon nanotube-graphene hybrid 140. The doped portion of the carbon nanotube-graphene hybrid 140 (between the metal source and drain) acts as the channel of the FET.

Figure 11:
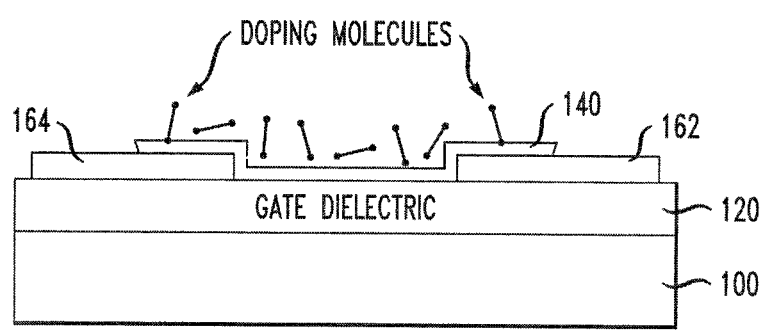
FIG. 11 illustrates another embodiment of forming a carbon nanotube FET (CNFET), according to an embodiment of the present invention.

FIG. 11 illustrates another embodiment of forming a carbon nanotube-graphene hybrid FET, or more generally, a FET with a channel comprising a nano-component such as other semiconducting nanotube-graphene hybrids, nanowires or nanocrystal films. After the formation of gate dielectric 120 on substrate 100, metal portions 162 and 164 are formed on gate dielectric 120 using a resist liftoff process (not shown) similar to that described for FIGS. 7-10. Metal portions 162 and 164, each having a thickness from about 15 nm to about 300 nm, form the FET source and drain. Metals such as Pd, Ti, W, Au, Co and Pt, and alloys thereof, or one or more metallic nanotube-graphene hybrids can be used for the metal portions 162, 164. A carbon nanotube-graphene hybrid 140, or more generally, a nano-component, is then disposed, for example, by spin-coating, over the gate dielectric 120 and the metal portions 162 and 164. Blanket doping of the carbon nanotube-graphene hybrid 140 is achieved by immersing the structure in an organic solution comprising a suitable dopant. The dopant molecules bond to the carbon nanotube-graphene hybrid, for example, via charge transfer interaction with the nitrogen of a dopant (for example, such as detailed herein) donating a lone pair of electrons to the carbon nanotube-graphene hybrid. In this illustration, the portion of the carbon nanotube-graphene hybrid 140 in contact with the gate dielectric 120 forms the channel of the FET.

Alternatively, the carbon nanotube-graphene hybrid 140 can be selectively doped through a patterned resist (not shown) that is formed over the carbon nanotube-graphene hybrid 140. The patterned resist may be formed, for example, by depositing a suitable resist material over the carbon nanotube-graphene hybrid 140 and patterning using conventional lithographic techniques. Hydrogensilsesquioxanes (HSQ), a dielectric that can be used as a negative resist, may be used for this purpose. Also, in an aspect of the invention, conventional resist materials can be used such as poly(methyl methacrylate) (PMMA), etc. This is made possible due to the use of water soluble dopants such as cerium ammonium nitrate, cerium ammonium sulfate, and ruthenium bipyridyl complex.

Figure 12:
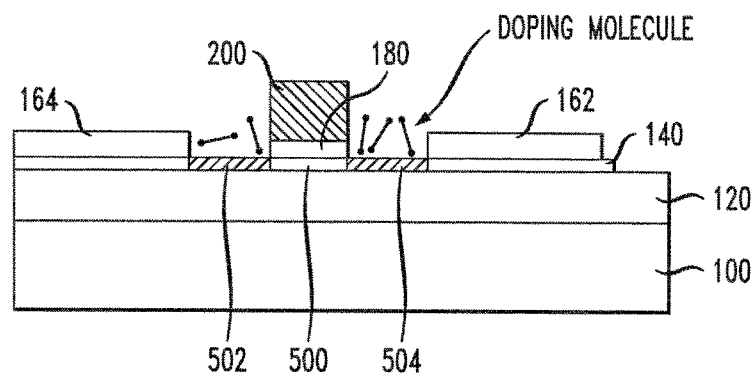
FIG. 12 illustrates an embodiment of a dual-gate CNFET, according to an embodiment of the present invention.

FIG. 12 illustrates an embodiment of a dual-gate carbon nanotube-graphene hybrid FET, or more generally, a FET with a channel comprising a nano-component such as other semiconducting nanotube-graphene hybrids, nanowires or nanocrystal films. After the gate dielectric 120 is formed over the substrate 100, which acts as a first gate (also referred to as a bottom or back gate), a carbon nanotube-graphene hybrid, or more generally, a nano-component 140 is deposited on gate dielectric 120. Metal portions 162, 164 are formed over the carbon nanotube-graphene hybrid 140 using a resist liftoff technique such as that described in connection with FIGS. 7-10. After metal portions 162, 164 are formed (acting as source and drain of the FET), the structure containing the carbon nanotube-graphene hybrid 140 and metal portions 162, 164 is covered with a dielectric layer 180, which can be a low temperature oxide (LTO) or a CVD high dielectric material such as hafnium dioxide.

A second gate 200 (also referred to as top or front gate), which can include a metal or highly doped polysilicon, is formed over the dielectric layer 180, for example, by first depositing a gate material over dielectric layer 180 and then patterning to form top gate 200. With the top gate 200 acting as an etch mask, the dielectric layer 180 is etched such that only the portion underneath the top gate 200 remains, as shown in FIG. 12. As an example, a dilute hydrofluoric acid (HF) such as 100:1 HF can be used as an etchant for LTO.

Additionally, the device is immersed in a dopant solution to achieve partial doping of the carbon nanotube-graphene hybrid 140. In this case, the channel includes both the gated undoped region 500 and the two doped regions 502 and 504. The doped regions 502 and 504 act like the "extensions" of a complementary metal-oxide-semiconductor (CMOS) FET, resulting in reduced contact barrier and improvements in drive current and transistor switching. The device can be operated by either the top gate 200 or the bottom gate 100, or both. In logic applications, it is desirable to operate a FET with the top gate configuration for good alternating current (AC) performance.

Figure 13:
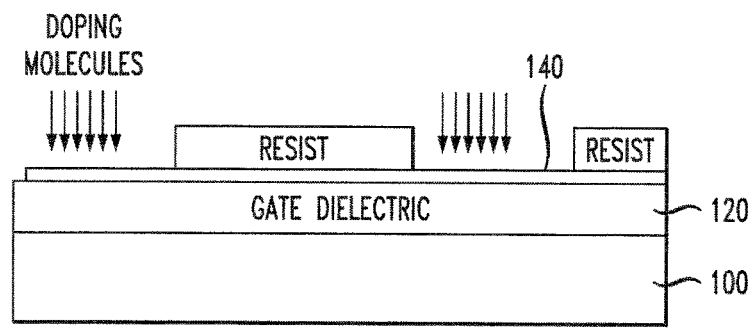
FIG. 13 illustrates a step in another embodiment of forming a CNFET, according to an embodiment of the present invention.
Figure 14:
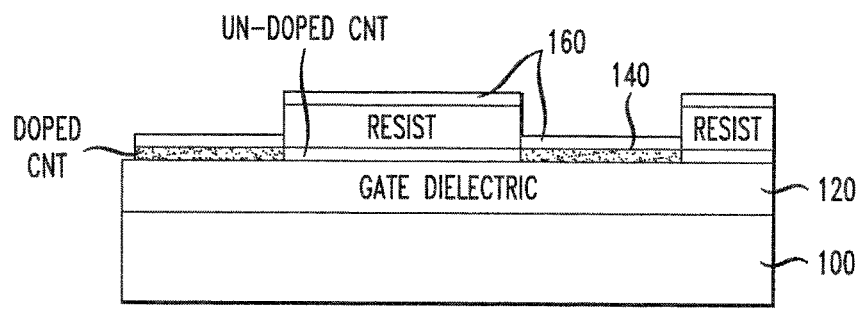
FIG. 14 illustrates a step in another embodiment of forming a CNFET, according to an embodiment of the present invention.
Figure 15:
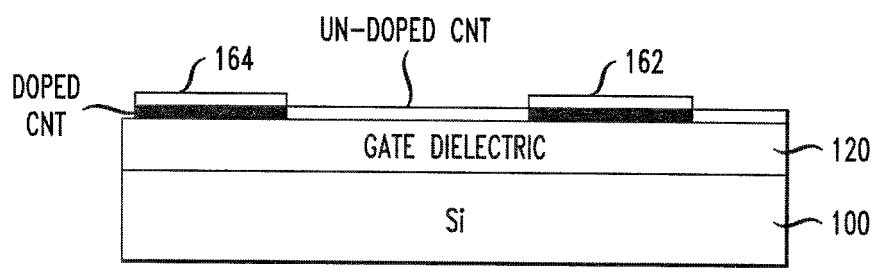
FIG. 15 illustrates a step in another embodiment of forming a CNFET, according to an embodiment of the present invention.

As detailed below, FIGS. 13-15 illustrate steps in another embodiment of forming a carbon nanotube-graphene hybrid FET, or more generally, a FET with a channel comprising a nano-component such as other semiconducting nanotube-graphene hybrids, nanowires or nanocrystal films. After the carbon nanotube-graphene hybrid or nano-component 140 is deposited on gate dielectric 120, which has previously been formed over substrate 100, a patterned resist is formed on the carbon nanotube-graphene hybrid 140 using conventional lithographic techniques such as e-beam or photolithography.

The structure (shown in FIG. 13) containing the patterned resist and carbon nanotube-graphene hybrid 140 is immersed in an organic solution including a suitable dopant (as detailed herein). The doping molecules bond to the exposed portions of the carbon nanotube-graphene hybrid 140. Following doping of the nanotube-graphene hybrid 140, a metal layer 160 having a thickness ranging from about 15 nm to about 50 nm is deposited over the patterned resist and the doped carbon nanotube-graphene hybrid 140. As previously described, Pd, Ti, W, Au, Co, Pt, or alloys thereof, or one or more metallic nanotube-graphene hybrids can be used for metal 160. Metallic nanotube-graphene hybrids can be deposited using solution phase techniques such as spin coating, while electron beam or vacuum evaporation can be used for deposition of other metals or alloys.

Following deposition of the metal, the structure shown in FIG. 14 is immersed in acetone or NMP for resist liftoff. As shown in FIG. 15, metal portions 162, 164 remaining after resist liftoff form the source and drain of the FET. The process of FIGS. 13-15 generates a significant doping profile difference along the channel of the carbon nanotube-graphene hybrid transistor. Note that in this case, the undoped portion (portion 500 in FIG. 12, for example) of the carbon nanotube-graphene hybrid 140 forms the channel of the FET.

To complete the formation of the FET devices illustrated in FIGS. 13-15, passivation can be performed by covering the respective devices with a spin-on organic material like poly(methyl methacrylate) (PMMA) or hydrogensilsesquioxanes (HSQ)—a low K dielectric layer, or by depositing a low temperature dielectric film such as silicon dioxide. Further processing of the device is accomplished via metallization for the back-end of the line.

Also, as detailed herein, an aspect of the invention includes using the nanotube-graphene hybrid film as a coating for a transparent conductor.

Another aspect of the invention includes a process to deposit graphene over CNTs directly through chemical vapor deposition (CVD). The process to deposit graphene over CNTs directly through CVD includes depositing CNT films over thin copper foils (nickel substrate can be used for this purpose also). This can be done using variety of techniques such as forming a self-assembled monolayer of aminopropyl triethoxy silane (APTES) or any other amine terminated group over copper (the top surface can be copper oxide) and then depositing CNTs from an aqueous solution. This can also be done via depositing CNTs over copper foil from an organic solvent such as dichloroethane/benzene/N-Methyl-2-pyrrolidone (NMP), etc. The solvent vaporizes, leaving behind CNT films Additionally, depositing CNTs can also be accomplished via spraying CNT solutions and letting them dry.

The copper foil with as-deposited CNT film is placed in a CVD furnace to grow graphene (accordingly to techniques widely known by one skilled in the field). Briefly, hydrocarbon gases such as methane, ethylene, acetylene, carbon monoxide, etc. acting as the carbon carriers get dissociated over copper atoms at a high temperature, saturating the atoms with carbon, and eventually causing the formation of graphene. This process is known to be self-limiting; that is, after formation of a first layer of graphene, the process automatically stops and no further carbon layers are formed. The resulting product after CVD is graphene sheets grown around CNTs. At a high temperature, because there are no other residues, this process results in a very good contact between CNT and graphene.

Further, the CNT-graphene hybrid film is transferred over the desired substrate. This can be achieved in a variety of way. Merely by way of example, a polymer layer can be spun over copper foil, the polymer contacting the CNT-graphene films Thereafter, copper is chemically etched using $FeCl_3$ or any other copper solvent. The polymer layer left floating in the chemical bath is then cleaned with deionized (DI) water (and also, if needed, with dilute acid solutions to completely remove copper and remaining Fe). The polymer is then transferred onto a substrate of choice (with graphene-CNT layer facing the substrate). The polymer layer is then dissolved in an organic solvent such as acetone, NMP, etc., leaving graphene-CNT film on the substrate.

Additionally, in an embodiment of the invention, multiple sheets of CNT-graphene hybrid material can be transferred over each other by repeating the above-detailed steps.

Figure 16:
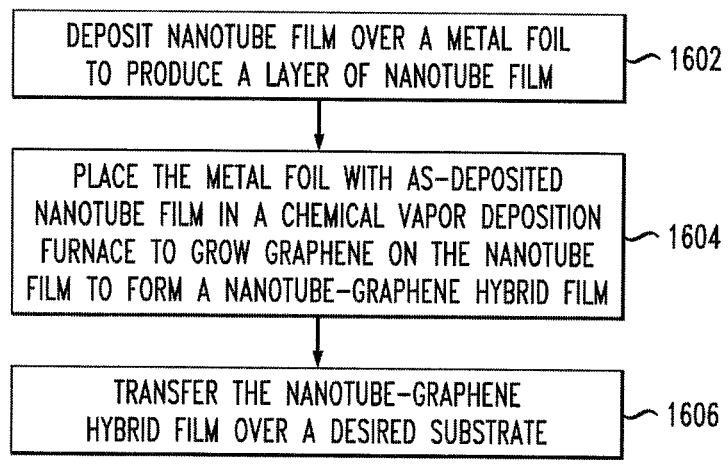
FIG. 16 is a flow diagram illustrating techniques for forming a nanotube-graphene hybrid film substrate, according to an embodiment of the present invention.

FIG. 16 is a flow diagram illustrating techniques for forming a nanotube-graphene hybrid film on a substrate, according to an embodiment of the present invention. Step 1602 includes depositing nanotube film over a metal foil to produce a layer of nanotube film. As described herein, depositing a layer of nanotube film over a metal foil to produce a layer of nanotube film can include forming a self-assembled monolayer of an amine terminated group over a copper foil and depositing a nanotube film from an aqueous solution, depositing a nanotube film over copper foil from an organic solvent, spraying a nanotube film solution on the metal foil and allowing the solution to dry, etc.

Step 1604 includes placing the metal foil with as-deposited nanotube film in a chemical vapor deposition furnace to grow graphene on the nanotube film to form a nanotube-graphene hybrid film. Placing the metal foil with as-deposited nanotube film in a chemical vapor deposition furnace to grow graphene includes saturating copper atoms with a carbon gas at a temperature that causes formation of graphene.

Step 1606 includes transferring the nanotube-graphene hybrid film over a desired substrate. The techniques of FIG. 16 can also include repeating steps 1602, 1604 and 1606 to form multiple sheets of the nanotube-graphene hybrid film.

Additionally, as detailed herein, an embodiment of the invention includes a field effect transistor with a carbon nanotube-graphene hybrid nano-component, which includes a gate, a gate dielectric formed on the gate, a channel comprising a carbon nanotube-graphene hybrid nano-component formed on the gate dielectric, a source formed over a first region of the carbon nanotube-graphene hybrid nano-component, and a drain formed over a second region of the carbon nanotube-graphene hybrid nano-component to form a field effect transistor.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method for forming a carbon nanotube-graphene hybrid film on a substrate, comprising:
depositing carbon nanotubes over a metal foil to produce a carbon nanotube film;
placing the metal foil with as-deposited carbon nanotube film in a chemical vapor deposition furnace to grow graphene on the carbon nanotube film to form a carbon nanotube-graphene hybrid film; and
transferring the carbon nanotube-graphene hybrid film over a substrate.

2. The method of claim 1, wherein depositing carbon nanotubes over a metal foil to produce a carbon nanotube film comprises forming a self-assembled monolayer of an amine terminated group over a copper foil and depositing the carbon nanotubes from an aqueous solution.

3. The method of claim 1, wherein depositing carbon nanotubes over a metal foil to produce a carbon nanotube film comprises depositing the carbon nanotubes over copper foil from an organic solvent.

4. The method of claim 1, wherein depositing carbon nanotubes over a metal foil to produce a carbon nanotube film comprises spraying a carbon nanotube solution on the metal foil and allowing the solution to dry.

5. The method of claim 1, wherein placing the metal foil with as-deposited carbon nanotube film in a chemical vapor deposition furnace to grow graphene comprises saturating copper atoms with a carbon gas at a temperature that causes formation of graphene.

6. The method of claim 1, wherein depositing carbon nanotubes over a metal foil comprises performing a vacuum filtration process.

7. The method of claim 1, wherein depositing carbon nanotubes over a metal foil comprises performing a spray deposition of the carbon nanotubes over the metal foil.

8. The method of claim 1, wherein depositing carbon nanotubes over a metal foil comprises drop casting a carbon nanotube solution onto the metal foil.

9. The method of claim 1, wherein depositing carbon nanotubes over a metal foil comprises performing a chemical vapor deposition growth process.

10. The method of claim 1, wherein depositing carbon nanotubes over a metal foil comprises performing a water-surfactant solution based carbon nanotube deposition process.

11. The method of claim 1, further comprising removing impurities from a surface of the carbon nanotube film.

12. The method of claim 11, wherein said removing impurities from a surface of the carbon nanotube film comprises annealing the carbon nanotube film under reduced pressure to remove any dried solvent.

13. A method for forming a nanotube-graphene hybrid film on a substrate, comprising:
depositing nanotubes over a metal foil to produce a nanotube film;
placing the metal foil with as-deposited nanotube film in a chemical vapor deposition furnace to grow graphene on the nanotube film to form a nanotube-graphene hybrid film;
removing impurities from a surface of the nanotube-graphene hybrid film; and
transferring the nanotube-graphene hybrid film over a substrate.

14. The method of claim 13, wherein said removing impurities from a surface of the nanotube-graphene hybrid film comprises using an acid, solvent and water cleaning technique.

15. The method of claim 13, wherein said removing impurities from a surface of the nanotube-graphene hybrid film comprises annealing the nanotube-graphene hybrid film under reduced pressure to remove any dried solvent.

16. A method for forming a nanotube-graphene hybrid film on a substrate, comprising:
depositing nanotubes over a metal foil to produce a nanotube film, wherein the nanotube film comprises a network of single wall carbon nanotubes;
placing the metal foil with as-deposited nanotube film in a chemical vapor deposition furnace to grow graphene on the nanotube film to form a nanotube-graphene hybrid film; and
transferring the nanotube-graphene hybrid film over a substrate.

* * * * *